US008969914B2

(12) United States Patent
Chalamala et al.

(10) Patent No.: US 8,969,914 B2
(45) Date of Patent: Mar. 3, 2015

(54) ESD POWER CLAMP WITH STABLE POWER START UP FUNCTION

(75) Inventors: Sreenivasa Chalamala, Dresden (DE); Matthias Baer, Hohenstein-Ernstthal (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 1319 days.

(21) Appl. No.: 12/186,630

(22) Filed: Aug. 6, 2008

(65) Prior Publication Data

US 2009/0197377 A1 Aug. 6, 2009

(30) Foreign Application Priority Data

Jan. 31, 2008 (DE) .......................... 10 2008 006 963

(51) Int. Cl.
*H01L 29/66* (2006.01)
*H01L 23/62* (2006.01)
*H01L 27/02* (2006.01)

(52) U.S. Cl.
CPC .................................. *H01L 27/0285* (2013.01)
USPC ........... 257/174; 257/173; 257/172; 257/355; 257/356; 257/357; 361/56; 361/111; 361/91.1; 327/374

(58) Field of Classification Search
USPC .......... 438/231; 257/E21.632, 355–358, 360, 257/E27.059, E27.06; 361/56, 91.1
See application file for complete search history.

(56) References Cited

U.S. PATENT DOCUMENTS

| | | | | |
|---|---|---|---|---|
| 4,494,997 A | * | 1/1985 | Lemnios et al. | 438/521 |
| 5,438,292 A | * | 8/1995 | Tadokoro | 327/206 |
| 6,552,886 B1 | * | 4/2003 | Wu et al. | 361/56 |
| 7,027,275 B2 | * | 4/2006 | Smith | 361/56 |
| 7,457,086 B2 | * | 11/2008 | Chatty et al. | 361/56 |
| 7,782,580 B2 | * | 8/2010 | Gauthier et al. | 361/56 |
| 2005/0018370 A1 | | 1/2005 | Arai et al. | 361/56 |
| 2005/0205963 A1 | * | 9/2005 | Johnson et al. | 257/510 |
| 2006/0039093 A1 | | 2/2006 | Gauthier, Jr. et al. | 361/56 |
| 2007/0171587 A1 | | 7/2007 | Lee et al. | 361/56 |
| 2008/0123228 A1 | * | 5/2008 | Hung | 361/56 |

OTHER PUBLICATIONS

Official Communication from German Patent and Trademark Office; Translation of Official Communication dated Jul. 28, 2008.

* cited by examiner

*Primary Examiner* — Chuong A Luu
*Assistant Examiner* — Cory Eskridge
(74) *Attorney, Agent, or Firm* — Amerson Law Firm, PLLC

(57) ABSTRACT

An integrated circuit including a first power rail, a second power rail, a power clamp connected between the first and second power rails; and a trigger circuit connected to the power clamp and the first second power rails. The trigger circuit includes an RC element formed on the basis of field effect transistors, first inverter stage connected to the RC element, a second inverter stage, and a third inverter stage. The first, second and third inverter stages are connected in series to a control input of the power clamp. The trigger circuit also included a feed back connection from an output of the second inverter stage to the first inverter stage.

22 Claims, 4 Drawing Sheets

$T_{V_{DD}}$ small: ⇒ T1r < T2r
($< \sim 100\text{ns}$)
$T_{V_{DD}}$ high: ⇒ T1r > T2r
($> \sim 200\text{ns}$)

ESD POWER CLAMP WITH STABLE POWER START UP FUNCTION

BACKGROUND

1. Field of the Disclosure

The present disclosure generally relates to the field of integrated circuits having an internal circuitry and a protection circuit to minimize the risk of damage due to electrostatic discharge (ESD) events.

2. Description of the Related Art

In modern integrated circuits usually a very large number of individual circuit elements, such as field effect transistors, capacitors, resistors and the like are formed on a small substrate area to provide the required functionality of the circuitry. Typically, a number of contact pads are provided, which, in turn, are electrically connected to respective terminals, also referred to as pins, to allow the circuitry to communicate with the environment to provide the required input/output (I/O) capabilities. As feature sizes of the circuit elements are steadily shrinking to increase packing density and enhance performance of the integrated circuit, the ability for withstanding an externally applied over-voltage to any of the pins of the integrated circuit decreases significantly. One reason for this resides in the fact that decreasing feature sizes of field effect transistors, which is a dominant design component of complex circuitry based on CMOS technology, i.e., reducing the channel length of the field effect transistor, typically also requires scaling down the thickness of the insulation layer separating the gate electrode from the channel region in order to maintain controllability of a channel that forms at the gate insulation layer upon application of an appropriate control voltage to the gate electrode. Any overvoltage supplied to the thin gate insulation layer, however, will lead to defects in the gate insulation layer, resulting in reduced reliability, or to destruction, possibly resulting in a complete failure of the integrated circuit.

One major source of such over-voltages are so-called electrostatic discharge (ESD) events, wherein an object carrying charges is brought into contact with one or more of the pins of the integrated circuit. For example, a person can develop very high static voltage from a few hundred to several thousand volts, merely by moving across a carpet, so that an integrated circuit may be damaged when the person contacts the integrated circuit, for example, by removing the integrated circuit from the corresponding circuit board. A corresponding overvoltage caused by an ESD event may even occur during the manufacturing of the integrated circuit and may thus lead to a reduced product yield. Moreover, nowadays there is an increasing tendency to use replaceable integrated circuits in electronic systems so that only one or more integrated circuits have to be replaced instead of the whole circuit board in order to, for example, upgrade microprocessors and memory cards. Since the re-installation or replacement of integrated circuits is not necessarily carried out by a skilled person in an ESD-safe environment, the integrated circuits have to be provided with corresponding ESD protection. To this end, a number of protective circuits have been proposed that are typically arranged between a terminal of the integrated circuit and the internal circuit to provide a current path ensuring that the voltage applied to the internal circuit remains well below a specified critical limit. For example, in a typical ESD event caused by a charge carrying person, a voltage of several thousand volts is discharged in a time interval of about 100 ns (nanoseconds) or less, thereby creating a current of several amperes. Thus, the ESD protection circuit must allow a current flow of at least several amperes to ensure that the voltage across the ESD protection circuit does not exceed the critical limit.

A plurality of ESD protection circuits have been developed which basically attempt to provide appropriately designed current paths in order to discharge excess charge without damaging the sensitive circuit components of functional blocks in the integrated circuit. For example, a relatively straightforward approach is frequently used, in which each of the input/output terminals may be associated with a dedicated protection circuit, for instance in the form of diodes to enable a current flow between a respective pair of input/output terminals, across which an undesired high voltage may occur during an ESD event. Respective approaches may be referred to as pad-based ESD protection. Hence, in this case, a solid ESD current path has to be provided, which may provide the required current drive capability in both possible current flow directions. In CMOS technology, for this purpose, frequently NMOS transistor elements may be used with several configurations, such as gate grounded NMOS transistors, gate coupled NMOS transistors and the like. Typically, the NMOS transistor element may be operated during an ESD event by using the parasitic bipolar transistor, which, however, may, in sophisticated CMOS technologies, require significant efforts in obtaining sufficient current drive capabilities of the respective parasitic components. Therefore, the design of appropriate ESD protection circuits using the pad-based approach may be less flexible with respect to portability to different manufacturing technologies.

In another strategy, the excess charge created by an ESD event may be supplied to the supply voltage power rail and may then be shorted to the ground via an appropriately designed power clamp circuit, which may be provided in the form of an appropriately designed transistor element. Since the power clamp must not be enabled during normal operational conditions, for instance during power up and continuous operation, a trigger circuit may be required to appropriately activate the power clamp upon occurrence of an ESD event, while avoiding the activation of the power clamp in other cases. Although this approach, frequently referred to as rail-based ESD protection, may include more complex circuitry and may involve a high current path via a first ESD protection element connecting a respective input/output terminal with the $V_{DD}$ power rail and subsequently connecting the power rail to the ground rail via the power clamp circuit, this technique is less dependent on technology-specific characteristics and may therefore provide a higher degree of flexibility during technology changes. For this reason, the rail-based ESD protection technique may be frequently employed in complex CMOS technology. However, although significant advantages with respect to design flexibility and independence of technological characteristics may be provided by the rail-based approach, in certain approaches, the high probability of creating erroneous trigger situations may occur, which will be explained in more detail with reference to FIGS. 1a-1c.

FIG. 1a schematically illustrates an integrated circuit 100 comprising a typical rail-based protection circuitry which may include a primary ESD protection circuit 110, for instance, provided in the form of a high current diode structure, as previously explained. The primary ESD circuit 110 may thus be directly connected to an input/output pad 103, which may be connected to an output stage 104 of a functional block 105 of the integrated circuit 100, which has to be protected with respect to high voltage pulses, such as ESD events. Thus, the primary ESD circuit 110 may typically be designed so as to restrict a voltage at the input/output pad 103 to a tolerable value during certain ESD events. Furthermore, a secondary ESD circuit 120 may be connected to an input stage 106 of the internal circuit 105 and may be coupled to the input/output pad 103 via a resistive structure 111. Hence, the secondary ESD circuit 120 may be essential in protecting the highly sensitive input stage 106, which may comprise advanced transistor elements having extremely sophisticated gate dielectrics, as previously discussed. Furthermore, the integrated circuit 100 typically comprises a first power rail 101, which may receive the supply voltage $V_{DD}$ during normal operation of the device 100. Similarly, a second power rail 102 is provided, i.e., a power rail for connecting the ground potential or "negative" supply voltage $V_{SS}$ to the circuit 100. Additionally, the circuit 100 comprises a further ESD protection circuit 130 including a trigger circuit 140 and a power clamp circuit 150. For example, the power clamp circuit 150 may be provided in the form of a high current N-channel field effect transistor having the required current drive capability for accommodating the high current flow created during an ESD event. The trigger circuit 140 comprises a trigger stage 160, which may comprise a resistor 161 and a capacitor 162, which may commonly define an RC time constant. Furthermore, the trigger circuit 140 comprises a first inverter stage 170, a second inverter stage 180 and a third inverter stage 190, connected in series between the trigger stage 160 and a control input 151 of the power clamp transistor 150.

During normal operation, the supply voltage may be applied across the first and second power rails 101 and 102, thereby resulting in the supply voltage occurring at the input node of the first inverter stage 170 after the settling time of the RC trigger stage 160. That is, if the RC time constant of the trigger stage 160 is significantly less than the rise time of the supply voltage upon powering up the circuit 100, the voltage at the input of the inverter stage 170 may rise substantially in the same manner as the slowly rising supply voltage at the power rail 101. Due to the chain of the inverter stages 170, 180, 190, the output of the last inverter stage 190, and thus the control gate 151 of the power clamp transistor 150, may remain in a low state, thereby avoiding a shorting of the power rails 101, 102.

FIG. 1b schematically illustrates the circuit 100 during the occurrence of an ESD event. It may be assumed that a high voltage signal, such as a contact with a human body and the like, may result in the creation of excess charge at the input/output pad 103. As previously indicated, a respective ESD pulse may have significantly shorter rise times in the order of approximately some tens of nanoseconds, which may be comparable to the RC time constant of the trigger stage 160. Thus, during the occurrence of the ESD event, the primary and secondary ESD circuits 110, 120 may become conductive and may connect the pad 103 to the power rail 101, thereby creating an increase of voltage across the power rails 101 and 102. Due to the relatively short rise time that may be comparable to the RC time constant of the trigger stage 160, the voltage at the input of the inverter stage 170 may remain at a relatively low level, while the "supply voltage" may rise in a fast manner according to the rise time of the ESD pulse. Consequently, the output of the first inverter stage 170 may turn into a high state, that is, it may follow the rising voltage $V_{DD}$, thereby also resulting in a high state at the control gate 151 of the power clamp transistor 150, which may therefore be turned on, thereby providing a conductive path between the power rails 101 and 102 for discharging the excess charge transferred to the input/output pad 103. Hence, the voltage at the input/output 103 may be maintained at a non-critical value, while also maintaining the voltage drop across the power rails 101, 102 at a non-critical value. Thus, upon appropriately dimensioning the RC time constant of the trigger stage 160, an appropriate trigger behavior of the ESD protection circuit 130 may be accomplished, in which it may be distinguished between a normal power up situation and the occurrence of a fast pulse, as is typically the case in ESD situations. However, in complex CMOS designs, resistors may typically be provided in the form of field effect transistors so as to save valuable semiconductor area in the chip. In this case, the trigger behavior of the circuit 160 may differ from the operational behavior described above for the following reasons.

FIG. 1c schematically illustrates the trigger circuit 160 in the conventional arrangement as described above on the left-hand side and the corresponding arrangement of the trigger circuit 160 in accordance with a design in which the resistor 161 is replaced by a P-channel transistor 163. Furthermore, as illustrated, the capacitor 162 may be provided in the form of the parasitic capacitance, i.e., the gate/drain and the gate/source capacitance of a field effect transistor 164. For this purpose, the transistor 163 is typically designed so as to exhibit a corresponding resistance to obtain, in combination with the parasitic capacitance of the transistor 164, the required RC time constant. However, due to the fact that the transistor 163 may become conductive only after exceeding the threshold voltage, which may be dependent on the overall design of the transistor 163, the actual RC time constant may be significantly higher at an initial phase upon applying voltage to the power rail 101. Hence, in this situation, the RC time constant of the trigger stage 160 as shown on the right-hand side may become comparable to the rise time of a power up situation, since the transistor 163 may not be conductive at all when the input voltage is below the threshold voltage, which may finally result in an incorrect triggering of the power clamp transistor 150. Thus, during power up events of the device 100, a significant current may be drawn by the power clamp transistor 150, which may significantly reduce overall performance of the device 100 in view of settling time and overall power consumption, while also requiring an increase current drive capability of a power source for supplying the circuit 100.

The present disclosure is directed to various methods and devices that may avoid, or at least reduce, the effects of one or more of the problems identified above.

SUMMARY OF THE DISCLOSURE

The following presents a simplified summary of the disclosure in order to provide a basic understanding of some aspects disclosed herein. This summary is not an exhaustive overview, and it is not intended to identify key or critical elements of the invention or to delineate the scope of the invention. Its sole purpose is to present some concepts in a simplified form as a prelude to the more detailed description that is discussed later.

Generally, the subject matter disclosed herein relates to techniques and electronic circuits in which area-efficient CMOS designs may be used in providing an efficient rail-based ESD protection circuit, that is, resistors may be replaced by field effect transistors, while, nevertheless, providing an improved trigger behavior of the ESD circuit during power up situations. To this end, the inverter stages used in the trigger circuit may be appropriately modified compared to conventional strategies to provide a different response to a fast rising "supply voltage" and a slowly rising normal supply voltage during an initial phase of an ESD situation or a power up, when an "RC" component comprised of field effect transistors may exhibit a moderately high RC time constant. In some illustrative aspects disclosed herein, this imbalance in the response of the inverter stages to the rising supply voltage may be efficiently "amplified" by providing a positive feedback from the second inverter stage to the first inverter stage, thereby reliably "clamping" the respective output nodes of these inverters to obtain the desired trigger behavior. Hence, erroneous trigger events during a power up situation may be avoided or at least substantially reduced.

One illustrative integrated circuit disclosed herein comprises a first power rail and a second power rail. Furthermore, a power clamp is connected between the first and second power rails and a trigger circuit is connected to the power clamp and the first and second power rails. The trigger circuit comprises an RC element formed on the basis of field effect transistors. The trigger circuit further comprises a first inverter stage connected to the RC element, a second inverter stage and a third inverter stage, which are connected in series to a control input of the power clamp. Furthermore, the trigger circuit comprises a feedback connection from an output of the second inverter stage to the first inverter stage.

One illustrative ESD protection circuit disclosed herein comprises a trigger node formed by a P-channel transistor and an N-channel transistor and a first inverter stage, a second inverter stage and a third inverter stage connected in series, wherein an input of the first inverter stage is connected to the trigger node. The ESD protection circuit further comprises an N-channel power clamp transistor having a drain/source path connected between a first power rail and a second power rail and having a gate terminal connected to an output of the third inverter stage. Additionally, the ESD protection circuit comprises a feedback P-channel transistor connected to the first and second inverter stages to provide a positive feedback signal.

One illustrative integrated circuit disclosed herein comprises a protection circuit configured to connect a first power rail with a second power rail. The protection circuit comprises a plurality of P-channel transistors and N-channel transistors connected to form a trigger circuit including a trigger stage, a first inverter stage, a second inverter stage and a third inverter stage. An output of the first inverter stage has a shorter rise time compared to a rise time of an output of the second inverter stage for high voltage signal applied to the first and second power rails that has a rise time of approximately 100 nanoseconds and less. Furthermore, the output of the first inverter stage has a longer rise time than a rise time of the output of the second inverter stage for a voltage signal applied to the first power rail that has a rise time of approximately 200 nanoseconds or more. Finally, the integrated circuit comprises an N-channel power clamp transistor connected to the trigger circuit.

BRIEF DESCRIPTION OF THE DRAWINGS

The disclosure may be understood by reference to the following description taken in conjunction with the accompanying drawings, in which like reference numerals identify like elements, and in which.

Figure 1A:
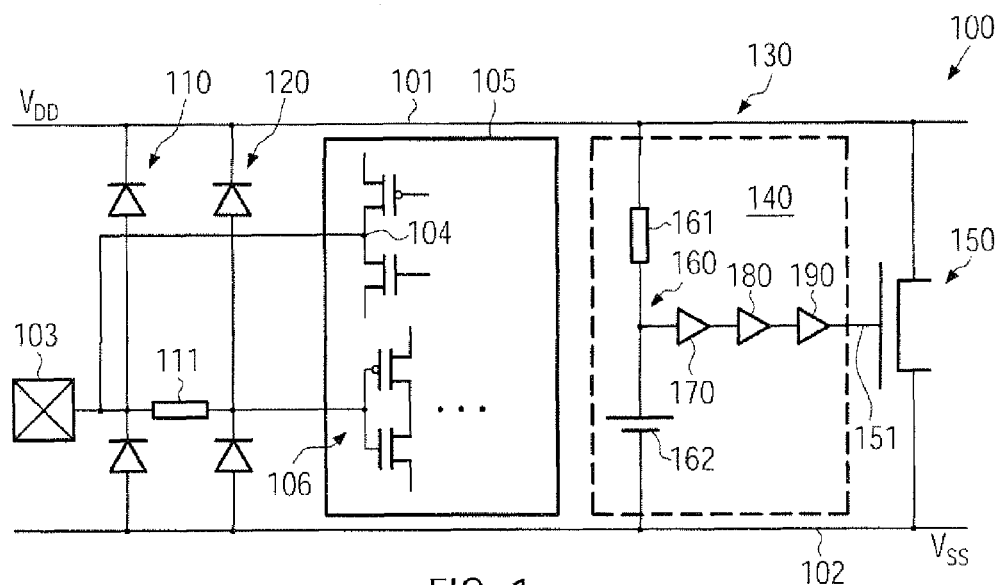
FIG. 1a schematically illustrates a circuit diagram of an integrated circuit including a rail-based ESD protection circuit with a trigger circuit on the basis of an RC element according to conventional designs.
Figure 1B:
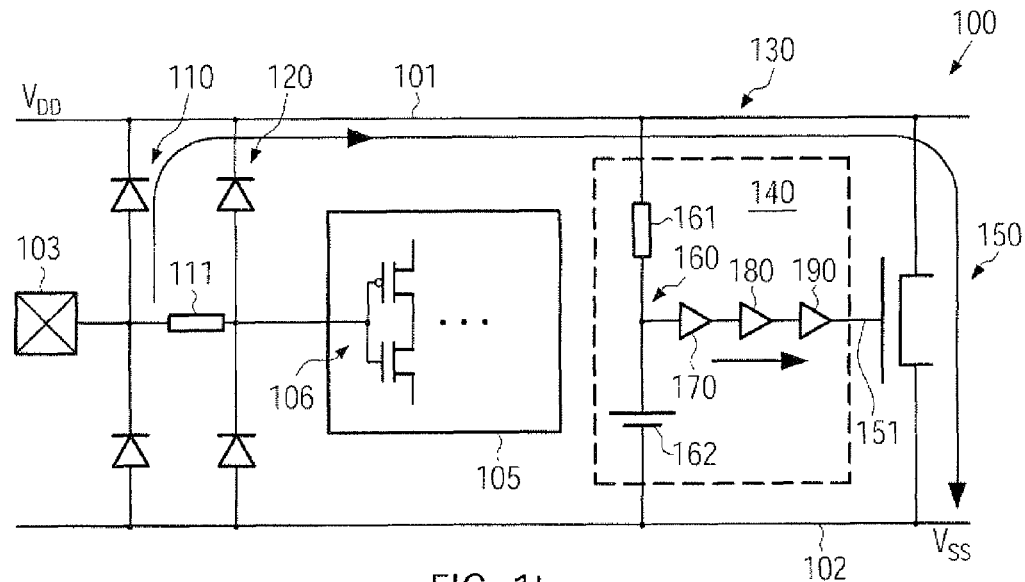
FIG. 1b schematically illustrates a circuit diagram of the conventional integrated circuit during an ESD event.
Figure 1C:
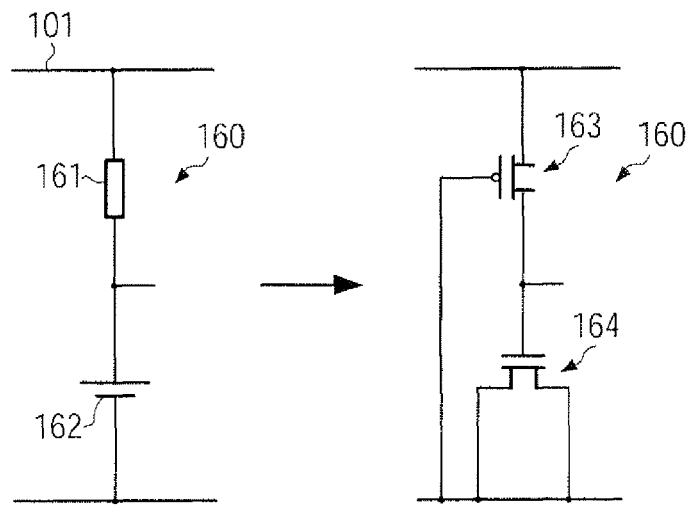
FIG. 1c schematically illustrates an RC component realized on the basis of field effect transistors according to a conventional approach.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the circuits and techniques disclosed herein provide an enhanced trigger behavior of ESD protection circuits, which may be designed in accordance with space-efficient design approaches, in which resistive structures are represented by field effect transistors. Since the RC time constant of an RC network comprised of field effect transistors may, at least at an initial phase of the normal power up situation, still be significantly high, thereby conventionally resulting in an erroneous triggering of the power clamp stage, the techniques disclosed herein provide an appropriate response of the trigger circuit such that, for moderately long rise times of the signal at $V_{DD}$, an "imbalance" between the first output node and the second output node of the inverter stages may be introduced and, in some illustrative aspects, "amplified" so as to substantially avoid the turning on of the power clamp stage. For this purpose, the design and the hardware configuration of the inverter stages may be appropriately adapted, while additionally a positive feedback loop may be established, so as to stabilize the desired imbalance in responding to voltage signals at the power rail $V_{DD}$ of different rise times and thus of different slew rates. Consequently, advanced design approaches for complex circuits on the basis of CMOS technology may be realized with enhanced performance due to the avoidance or at least significant reduction of miss-trigger events during a power up situation, while nevertheless providing the desired ESD protection behavior.

Figure 2A:
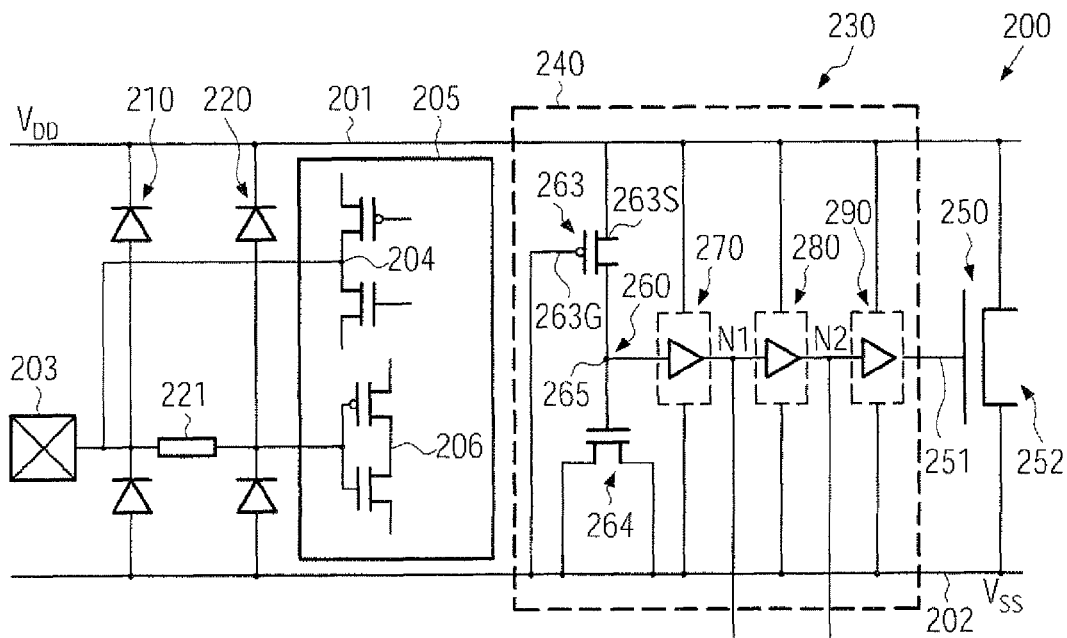
FIG. 2a schematically illustrates a circuit diagram of an integrated circuit comprising an ESD protection circuit including a trigger circuit having an improved trigger behavior during normal power up situations according to illustrative embodiments.

FIG. 2a schematically illustrates a circuit diagram of an integrated circuit 200, which may comprise an "internal" circuit 205 the components of which, such as input stages 206 and output stages 204, may have to be protected with respect to high current/high voltage events, such as ESD situations, in which undesired excess charge may be applied to an input/output pad 203. For example, a primary ESD circuit 210 may be directly connected to the input/output pad 203, for instance in the form of diode structures having a high current drive capability. Similarly, a secondary ESD circuit 220 may be connected to the input stage 206, which in turn may be connected to the pad 203 via a resistor 221. Furthermore, the circuit 200 may comprise an ESD protection circuit 230, which may include a trigger circuit 240 and an output power clamp stage 250 connected to the trigger circuit 240. For example, as previously explained, the power clamp stage 250 may be provided in the form of an N-channel transistor comprising a drain/source path 252 for connecting a first power rail 201, i.e., a power rail corresponding to the $V_{DD}$ line, with a second power rail 202, i.e., a power rail corresponding to ground or $V_{SS}$ potential. The drain/source path 252 may be controlled by a control input or gate terminal 251. Consequently, a voltage at the control terminal 251 above a threshold voltage of the power clamp stage 250 may result in a reduced resistivity of the drain/source path 252.

The trigger circuit 240 may comprise a trigger stage 260 representing an RC component comprised of a P-channel transistor 263 and an N-channel transistor 264 connected such that a trigger node 265 may be defined. Hence, the transistor 263 may act as a resistor when a voltage difference between a source terminal 263S and a gate terminal 263G is approximately at or above the threshold voltage of the transistor 263. The threshold voltage represents the voltage at which a source/drain path of the transistor 263 forms a conductive channel, the resistance value of which may be substantially constant for moderately low voltages $V_{DD}$. Thus, below the threshold value of the transistor 263, the trigger stage 260 may have a high RC constant, substantially defined by leakage currents of the transistor 263 and the capacitance of the transistor 264, as previously explained.

The trigger circuit 240 may further comprise a first inverter stage 270, a second inverter stage 280 and a third inverter stage 290, which are connected in series. That is, an output of the first inverter stage 270 may be connected to an input of the second inverter stage 280, thereby defining a first node N1. Similarly, an output of the second inverter stage 280 may be connected to an input of the third inverter stage 290, thereby defining a second node N2. Moreover, an output of the inverter stage 290 may be connected to the control terminal 251. As previously explained, the inverters 270, 280 and 290 may be formed on the basis of a circuit design using P-channel transistors and N-channel transistors, without providing space-consuming resistive structures so as to obtain a space-efficient overall circuit design for the circuit 200. Furthermore, the inverter stages 270, 280 and 290 may be designed such that, upon providing a voltage signal at the first power rail 201 having a rise time of approximately 100 nanoseconds and less, as may usually be the case during ESD events, the rise time T1r of the node N1 may be inherently less compared to a rise time T2r of node N2. For example, design-specific characteristics may be used, for instance, by appropriately selecting the pull-up and/or pull-down strength of the individual inverter stages 270, 280, 290, the threshold voltages of respective transistor elements comprised therein and the like, in order to obtain the desired behavior for voltages at $V_{DD}$ having a high slew rate.

Consequently, the operational behavior of the inverter stages 270, 280, 290 may be defined by design-specific characteristics and may, therefore, be appropriately implemented to the actual manufacturing process and may also result in an appropriate behavior during simulation and verification of the circuit 200. Furthermore, the inverter stages 270, 280, 290 may further be designed such that, for a voltage signal at the power rail 201 having a moderately "long" rise time of approximately 200 nanoseconds and more, the rise time T1r at node N1 may be longer compared to the rise time T2r at node N2, so that, in this situation, node N2 may charge up faster compared to node N1.

Figure 2B:
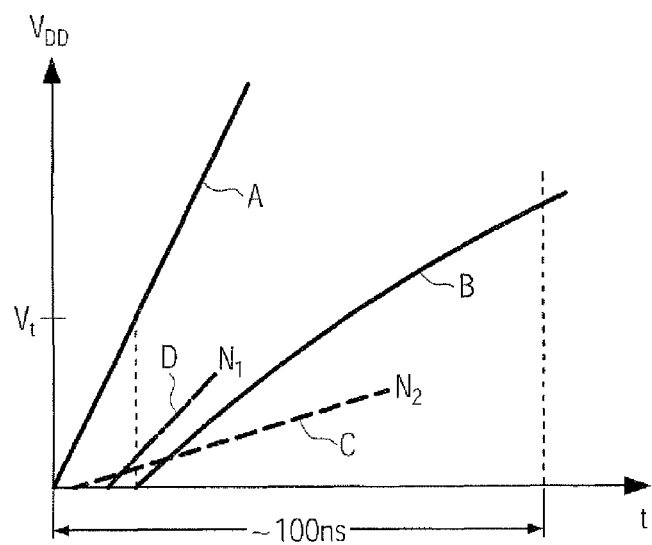
FIGS. 2b-2c schematically illustrate time diagrams of various voltages during an ESD event (FIG. 2b) and a normal power up situation (FIG. 2c) according to illustrative embodiments.

FIG. 2b schematically illustrates a time diagram, which qualitatively illustrates the situation for a fast rising signal at $V_{DD}$, as may typically occur during ESD events. In this case, a signal at the first power rail 201 may rise within a time interval of approximately 100 nanoseconds and significantly less, as indicated by curve A. Therefore, the trigger stage 260 may respond to the voltage $V_{DD}$ by charging the "capacitor" 264 when the respective threshold voltage $V_t$ of the transistor 263 is exceeded, as indicated by curve B. For convenience, the threshold voltage $V_t$ is illustrated as a relatively high value. On the other hand, the rising voltage $V_{DD}$ may result, according to the operational behavior as described with reference to FIG. 2a, in an increase of the voltages of the nodes N1 and N2, for instance via the respective P-channel transistors of the inverter stages 270, 280. For example, curve C representing the voltage at node N2 may, for instance, rise with a reduced slope compared to a voltage at the node N1, represented by curve D, which, for instance, may be accomplished by appropriately adjusting the current drive capabilities of the respective inverter stages. It should be appreciated that also respective threshold voltages of the transistors may be appropriately adjusted to obtain the desired behavior. Consequently, the slightly higher voltage at node N1 may maintain the voltage at N2 at a low level, thereby resulting in a high level at the last inverter stage 290, which may result in turning on the power clamp 250, thereby providing a discharge path through the drain/source path 252. Hence, in this case, the desired ESD behavior may be obtained.

Figure 2C:
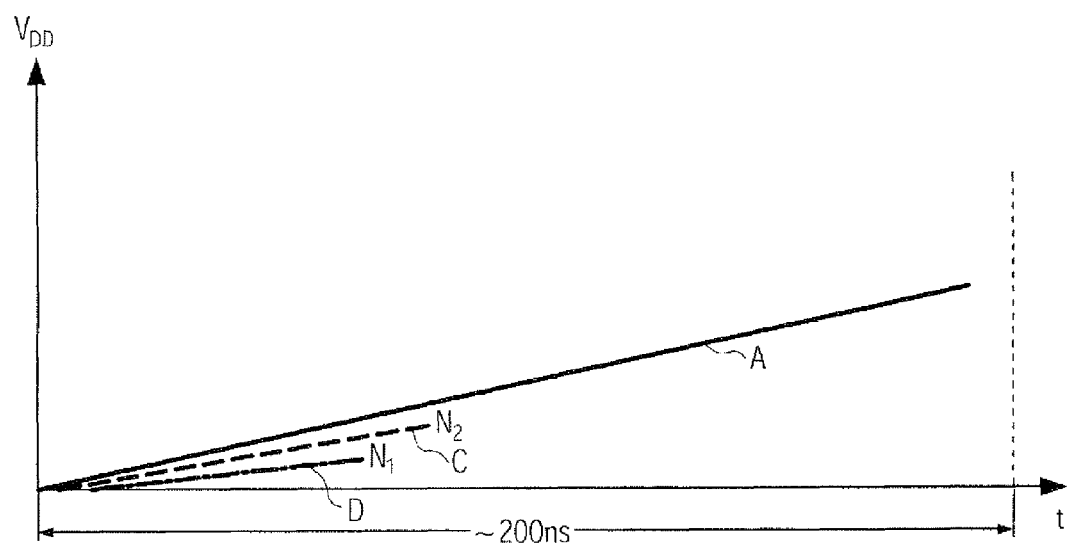

FIG. 2c schematically illustrates the situation for a slowly rising voltage at the power rail 201, which is qualitatively illustrated by curve A, wherein it may be assumed that, after a time interval of approximately 200 nanoseconds and significantly more, the voltage $V_{DD}$ may have settled. Thus, compared to the situation as shown in FIG. 2b, the voltage $V_{DD}$ represented by curve A may be considered as a signal having a moderately low slew rate. The trigger stage 260 may have a very high RC time constant until $V_{DD}$ has reached the threshold voltage of the corresponding transistor 261, as previously indicated. In this situation, however, due to appropriate configuration of the inverter stages 270, 280, 290, as previously described, the voltage at the node N2, indicated by curve C, may rise faster, for instance by providing transistors of a reduced threshold voltage in the inverter stage 280 compared to the stage 270, so that charging of node N2 may start earlier compared to node N1, even though the inverter stage 270 may have a higher current drive capability, as previously explained. Consequently, node N2 may drive inverter stage 290 so as to maintain its output and thus the control terminal 251 at a low level, thereby avoiding the turning on of the drain/source path 252. Consequently, during the initial phase of the voltage rise at the power rail 201, a miss triggering of the power output clamp 250 may be avoided.

Figure 2D:
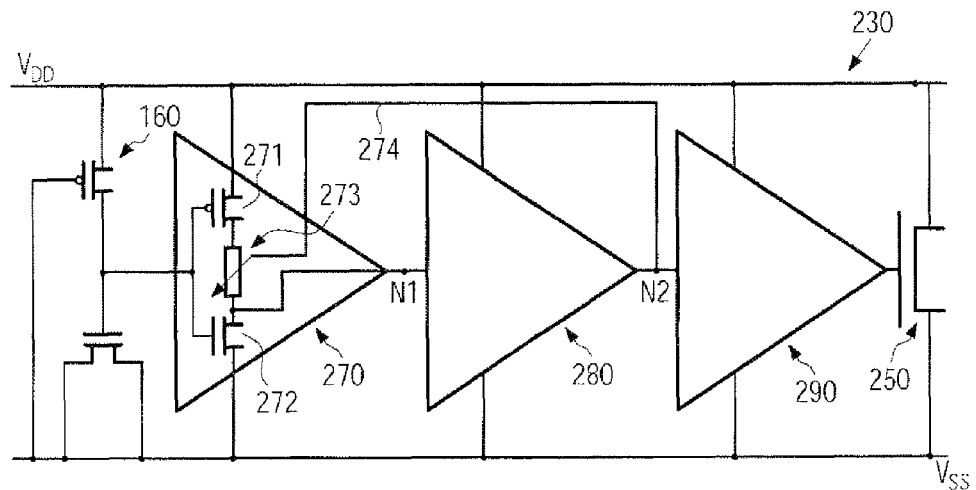
FIG. 2d schematically illustrates a circuit diagram of an ESD protection circuit including a positive feedback loop between a first inverter stage and a second inverter stage according to further illustrative embodiments.

FIG. 2d schematically illustrates the ESD protection circuit 230 according to further illustrative embodiments, in which the initially created imbalance between the different charging behavior at the nodes N1 and N2 during a normal power-up situation, as shown in FIG. 2c, may be stabilized. For this purpose, a positive feedback loop 274 may be provided between the inverter stage 280, that is, the output node N2, and the inverter stage 270, so as to maintain the node N1 at a low level during the time interval after the initial power-on event until the trigger circuit 260 may exhibit the desired behavior so as to force the output node N1 to a low level. For this purpose, the inverter stage 270 may be considered as comprising a P-channel transistor 271 and an N-channel transistor 272, wherein the resistance of the P-channel transistor 271 may be assumed to be a controllable "resistor," at least a portion of which may also be controlled by the voltage of N2, which is fed back via the loop 274. For example, as illustrated a "variable resistor" 273 may be provided in the current path between the power rail 201 and the output node N1, thereby enabling a slowing down of the charging up of the node N1, when the "resistor 273" has a higher resistance. In this sense, a positive feedback may be considered as a mechanism in which the loop 274 may provide an increased "resistance" of the "resistor" 273, when a voltage at N2 increases, while a decreasing voltage at N2 may result in a reduced resistance value of the "resistor" 273. Hence, when increasing the voltage at node N2, the resistance of the "resistor" 273 may also increase, thereby further reducing the charging up of the node N1. Finally, N1 will settle at $V_{SS}$, thereby clamping N2 to the rising voltage $V_{DD}$. Hence, a stable behavior of the output nodes N1 and N2 may be accomplished until finally the trigger voltage at the node 265 holds the node N1 at low level, as in the conventional trigger circuit, such as the trigger circuit 130 having a resistor in the trigger stage 160, as previously described.

Figure 2E:
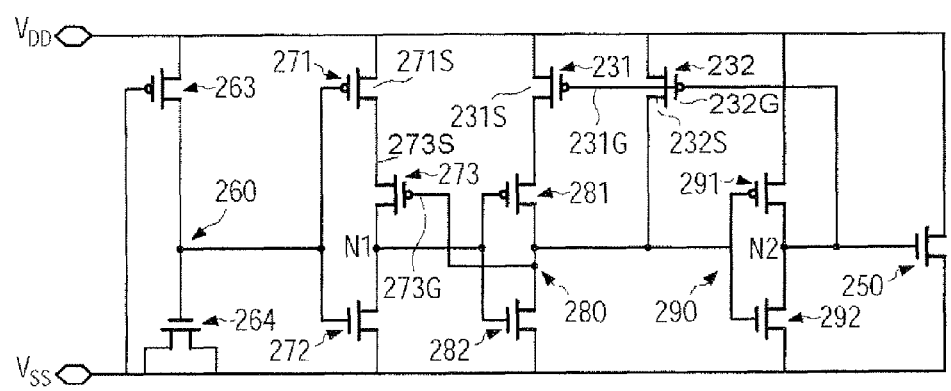
FIG. 2e schematically illustrates an ESD protection circuit including a P-channel transistor as a feedback component according to still further illustrative embodiments.

FIG. 2e schematically illustrates the ESD protection circuit 230 according to further illustrative embodiments. As illustrated, in the first inverter stage 270, the positive feedback is accomplished by a P-channel transistor 273 that is connected with its source/drain path 273S between the output node N1 and a source/drain path 271S of the P-channel transistor 271. Furthermore, a gate 273G is connected to the output node N2 of the second inverter stage 280. Thus, the desired positive feedback behavior may be accomplished, as previously explained. Furthermore, the inverter stage 280 may comprise a P-channel transistor 281 and an N-channel transistor 282, wherein a first field effect transistor, that is, a P-channel transistor 231, may be connected with its source/drain path 231S between the power rail 201 and a transistor 281, while the gate 231G may be connected to the control input 251. Furthermore, a second P-channel transistor 232 may be connected with its source/drain path 232S to the output node N2 of the second stage 280, while a gate 232G may be connected to the control input 251.

Thus, during an ESD event or any other fast rising voltage at the power rail 201, the ESD protection circuit 230 may respond as follows. Initially, all node voltages in the circuit may be zero. Upon application of the fast rising voltage at the power rail 201, node N1 may be charged faster compared to node N2, as previously explained, thereby creating a rising voltage, which causes the voltage at node N2 to decrease via the N-channel transistor 282. In this case, the control voltage for the feedback transistor 273 may also be pulled down, thereby further reducing the overall resistance in the current path that charges node N1 so that finally N1 will settle at the voltage currently occurring at the power rail 201, while node N2 may be clamped to the voltage at power rail 202, that is, $V_{SS}$. Consequently, the power clamp transistor 250 may be reliably turned on as desired.

During normal power-up mode, N2 may charge up to a slightly higher voltage compared to node N1 via the transistors 231 and 281 and also via the transistor 232, as previously explained. Again, the positive feedback provided by the transistor 273 may result in a stabilization, since the increasing voltage at N2 may further slow down the charging of node N1, thereby resulting in settling of N1 at $V_{SS}$, while N2 may settle at $V_{DD}$, thereby reliably maintaining the power clamp transistor 250 in its off state, as desired.

Consequently, an enhanced performance of the circuit 200 during standard power-on situations may be accomplished, although resistive structures may be realized by field effect transistors.

It should be appreciated that the circuit 200 may be manufactured on the basis of well-established techniques so that a predictable and reliable operational behavior may be obtained, as previously explained. For example, the respective circuit elements, i.e., the P-channel transistors and N-channel transistors, of the circuit 200 may be formed on the basis of well-established manufacturing techniques adapted to the technology standard under consideration. Thus, after designing and verifying the circuit 200 and, in particular, the ESD protection circuit 230, enhanced operational behavior may be obtained while, nevertheless, providing a space-efficient configuration.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:
1. An integrated circuit comprising:
a first power rail;
a second power rail;
a power clamp connected between said first and second power rail; and
a trigger circuit connected to said power clamp and said first and second power rails, said trigger circuit comprising:
an RC element formed on the basis of field effect transistors, a first inverter stage connected to said RC element, a second inverter stage and a third inverter stage, said first, second and third inverter stages connected in series to a control input of said power clamp, said trigger circuit further comprising a positive feedback connection from an output of said second inverter stage to said first inverter stage, wherein the positive feedback connection causes a resistance in a current path internal to the first inverter stage between the first power rail and an output of said first inverter stage to vary in response to variations in a voltage at the output of said second inverter stage.

2. The integrated circuit of claim 1, wherein said positive feedback connection comprises a feedback p-channel transistor that has a resistance that varies in response to variations in the voltage at the output of said second inverter stage.

3. The integrated circuit of claim 2, wherein an output node of said first inverter stage is connected to a drain terminal of an n-channel transistor of said first inverter stage and said feedback p-channel transistor is connected with its channel between said output node and a drain terminal of a p-channel transistor of said first inverter stage.

4. The integrated circuit of claim 3, wherein a gate terminal of said feedback p-channel transistor is connected to an output node of said second inverter stage.

5. The integrated circuit of claim 2, wherein the resistance of the feedback p-channel transistor decreases in response to the voltage at the output of said second inverter stage decreasing so that a rise time of an output node of said first inverter stage is less than a rise time of an output node of said second inverter stage for a voltage across said first and second power rails having a rise time of approximately 100 nanoseconds or less.

6. The integrated circuit of claim 2, wherein the resistance of the feedback p-channel transistor increases in response to the voltage at the output of said second inverter stage increasing so that a rise time of the output node of said first inverter stage is greater than a rise time of the output node of said second inverter stage for a voltage across said first and second power rails having a rise time of approximately 200 nanoseconds or more.

7. The integrated circuit of claim 1, further comprising a first p-channel transistor connected with its source/drain path between said first power rail and said second inverter stage, wherein a gate terminal of said first p-channel transistor is connected to said control input of said power clamp.

8. The integrated circuit of claim 7, further comprising a second p-channel transistor connected with its source/drain path between an output node of said second inverter stage and said first power rail, wherein a gate terminal of said second p-channel transistor is connected to said control input of said power clamp.

9. The integrated circuit of claim 1, wherein said power clamp comprises an n-channel transistor.

10. The integrated circuit of claim 1, further comprising a plurality of input/output pads and an ESD circuit connected to said plurality of input/output pads and configured to discharge positive excess charge to said first power rail and to discharge negative excess charge to said second power rail.

11. An integrated circuit comprising:
a power clamp configured to be connected between a first power rail terminal and a second power rail terminal;
an RC element configured to be connected between said first and second power rail terminals,
a first inverter stage connected to said RC element, a second inverter stage, and a third inverter stage, wherein said first, second and third inverter stages are connected in series to a control input of said power clamp; and
a positive feedback connection from an output of said second inverter stage to said first inverter stage, wherein the positive feedback connection causes a resistance in a current path internal to the first inverter stage between the first power rail terminal and an output of said first inverter stage to vary in response to variations in a voltage at the output of said second inverter stage.

12. The integrated circuit of claim 11, wherein said feedback connection comprises a feedback p-channel transistor that has a resistance that varies in response to variations in the voltage at the output of said second inverter stage.

13. The integrated circuit of claim 12, wherein the resistance of the feedback p-channel transistor decreases in response to the voltage at the output of said second inverter stage decreasing so that a rise time of an output node of said first inverter stage is less than a rise time of an output node of said second inverter stage for a voltage across said first and second power rail terminals having a rise time of approximately 100 nanoseconds or less.

14. The integrated circuit of claim 12, wherein the resistance of the feedback p-channel transistor increases in response to the voltage at the output of said second inverter stage increasing so that a rise time of the output node of said first inverter stage is greater than a rise time of the output node of said second inverter stage for a voltage across said first and second power rail terminals having a rise time of approximately 200 nanoseconds or more.

15. The integrated circuit of claim 11, further comprising a first p-channel transistor configured to be connected with its source/drain path between said first power rail and said second inverter stage, wherein a gate terminal of said first p-channel transistor is connected to said control input of said power clamp.

16. The integrated circuit of claim 15, further comprising a second p-channel transistor configured to be connected with its source/drain path between an output node of said second inverter stage and said first power rail terminal, wherein a gate terminal of said second p-channel transistor is connected to said control input of said power clamp.

17. The integrated circuit of claim 11, comprising a plurality of input/output pads and an ESD circuit connected to said plurality of input/output pads and configured to discharge positive excess charge to said first power rail terminal and to discharge negative excess charge to said second power rail terminal.

18. The integrated circuit of claim 11, comprising the first and second power rails coupled to the first and second power rail terminals, respectively.

19. An integrated circuit comprising:
a power clamp configured to be connected between first and second power rail terminals;
an RC element configured to be connected between said first and second power rail terminals,
a first inverter stage connected to said RC element, a second inverter stage, and a third inverter stage, wherein said first, second and third inverter stages are connected in series to a control input of said power clamp; and
a positive feedback connection from an output of said second inverter stage to an internal circuit path in said first inverter stage, wherein the positive feedback connection causes a rise time of the output node of said first inverter stage to vary in response to variations in a voltage at the output of said second inverter stage.

20. The integrated circuit of claim 19, wherein said positive feedback connection comprises a feedback p-channel transistor in said first inverter stage, the feedback p-channel transistor having a resistance that varies in response to variations in the voltage at the output of said second inverter stage.

21. The integrated circuit of claim 20, wherein the resistance of the feedback p-channel transistor decreases in response to the voltage at the output of said second inverter stage decreasing so that the rise time of an output node of said first inverter stage is less than a rise time of an output node of said second inverter stage for a voltage across said first and second power rail terminals having a rise time of approximately 100 nanoseconds or less.

22. The integrated circuit of claim 20, wherein the resistance of the feedback p-channel transistor increases in response to the voltage at the output of said second inverter stage increasing so that the rise time of the output node of said first inverter stage is greater than a rise time of the output node of said second inverter stage for a voltage across said first and second power rails having a rise time of approximately 200 nanoseconds or more.

* * * * *

UNITED STATES PATENT AND TRADEMARK OFFICE
CERTIFICATE OF CORRECTION

PATENT NO. : 8,969,914 B2  
APPLICATION NO. : 12/186630  
DATED : March 3, 2015  
INVENTOR(S) : Chalamala et al.

Page 1 of 1

It is certified that error appears in the above-identified patent and that said Letters Patent is hereby corrected as shown below:

In the Claims

In claim 12, at column 12, lines 10-11, delete "said feed-back" and insert therefor -- said positive feedback --.

Signed and Sealed this  
Twenty-third Day of June, 2015

Michelle K. Lee  
*Director of the United States Patent and Trademark Office*